(12) United States Patent
Le et al.

(10) Patent No.: US 6,721,215 B2
(45) Date of Patent: Apr. 13, 2004

(54) INTEGRATED DYNAMIC MEMORY AND METHOD FOR OPERATING IT

(75) Inventors: Thoai-Thai Le, Cary, NC (US); Jürgen Lindolf, Friedberg (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/185,628

(22) Filed: Jun. 28, 2002

(65) Prior Publication Data

US 2003/0002363 A1 Jan. 2, 2003

(30) Foreign Application Priority Data

Jun. 28, 2001 (DE) .......................................... 101 31 388

(51) Int. Cl.$^7$ ................................................ G11C 7/00
(52) U.S. Cl. ........................................ 365/200; 365/201
(58) Field of Search ................................. 365/200, 201, 365/230.03

(56) References Cited

U.S. PATENT DOCUMENTS

| 5,689,465 A | * 11/1997 | Sukegawa et al. .......... 365/200 |
| 6,188,619 B1 | 2/2001 | Jung |
| 6,427,186 B1 | * 7/2002 | Lin et al. ..................... 711/103 |

* cited by examiner

*Primary Examiner*—Huan Hoang
(74) *Attorney, Agent, or Firm*—Laurence A. Greenberg; Werner H. Stemer; Ralph E. Locher

(57) ABSTRACT

An integrated dynamic memory includes a memory cell array having memory cells each assigned to one of a plurality of groups. The plurality of groups are divided into defect-free groups having exclusively defect-free memory cells and into defective groups having at least one defective memory cell. The memory further includes a memory configuration table that contains a list of the defect-free groups and an assignment unit that, based upon the entries in the memory configuration table, executes memory accesses only to those memory cells assigned to a defect-free group. The total capacity of the memory module, then, is not fixed once and for all with fabrication, but, rather, results only after a memory test, or may even vary in the course of the module lifetime.

32 Claims, 2 Drawing Sheets

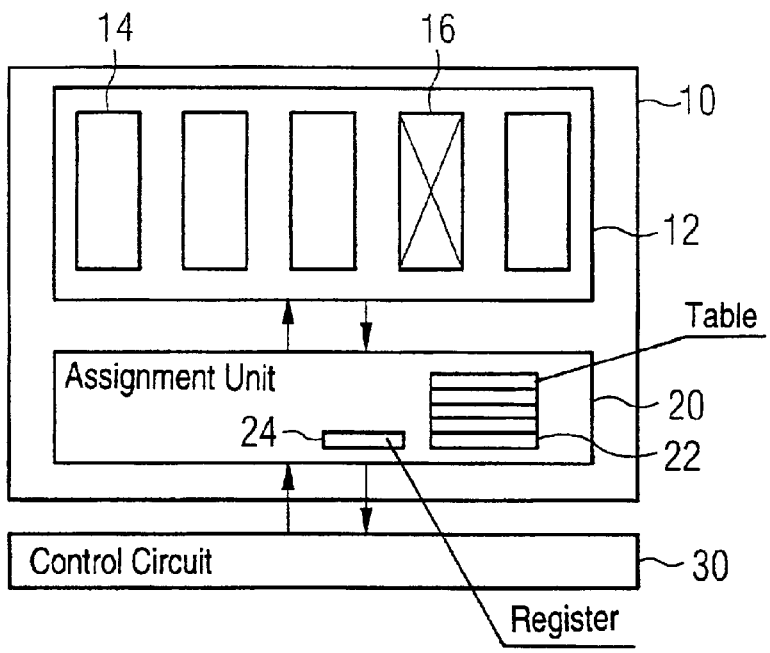
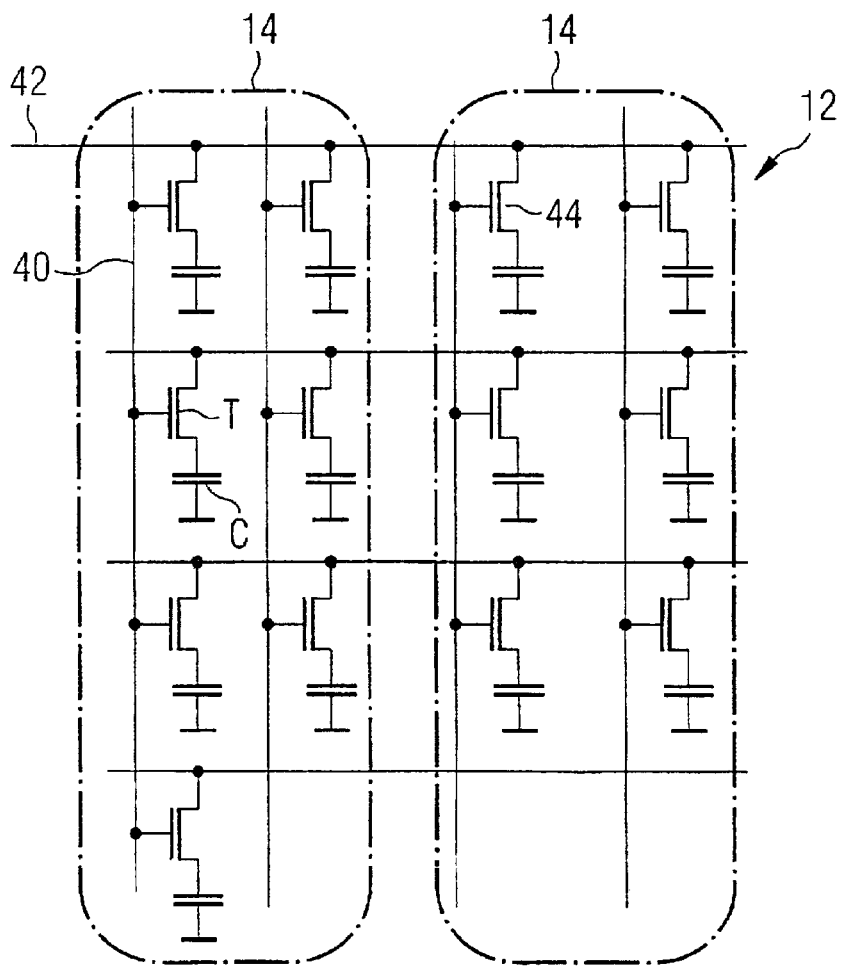

INTEGRATED DYNAMIC MEMORY AND METHOD FOR OPERATING IT

BACKGROUND OF THE INVENTION

Field of the Invention

The present invention relates to an integrated dynamic memory having a memory cell array having memory cells. The invention further relates to a method for operating such an integrated dynamic memory.

The memory area and the capacity of Dynamic Random Access Memory (DRAM) Chip modules are fixedly predetermined. This makes it necessary, in order to increase the yield in chip production, to take measures that ensure the predetermined storage capacity is reached.

To such an end, it is customary to provide on the memory modules a number of redundant memory cells that can replace a certain number of defective regular memory cells.

The memory modules are generally tested for functionality by the manufacturers before their delivery, and, as far as possible, are repaired. Such repair is done, for example, as follows: after chip production, memory defects are determined by targeted testing and recorded in a defect log. Then, by programmable elements, for example, a series of so-called laser fuses, individual word lines or bit lines containing defective memory cells are exchanged, in address terms, for defect-free redundant word lines or bit lines.

Such a redundancy concept makes it possible to increase the chip yield during fabrication. It has the disadvantage, however, that a certain proportion of redundant memory cells has to be provided. In such a case, it can happen, on one hand, that, for instance, in a well settled production process, only a small number of defective memory cells occur, so that the chip area used for the redundant memory area is taken up unnecessarily. If, on the other hand, the proportion of redundant memory cells is too small, the memory module as a whole can no longer be utilized and must be rejected.

SUMMARY OF THE INVENTION

It is accordingly an object of the invention to provide an integrated dynamic memory and method for operating it that overcome the hereinafore-mentioned disadvantages of the heretofore-known devices and methods of this general type and that provides an integrated dynamic memory having improved utilization of the regular memory area.

With the foregoing and other objects in view, there is provided, in accordance with the invention, an integrated dynamic memory, including a memory cell array having memory cells, each of the memory cells assigned to one of a plurality of cell groups, the plurality of cell groups divided into defect-free groups having exclusively defect-free memory cells and defective groups having at least one defective memory cell, a memory configuration table connected to the memory cell array and adapted to contain a list identifying the defect-free groups, and an assignment unit connected to the memory configuration table, the assignment unit programmed to execute memory accesses only to the memory cells of the defect-free groups based upon the list in the memory configuration table.

The invention is, thus, based on the concept of addressing the available memory area of the integrated memory by indirect addressing through an assignment unit. To that end, the memory area is firstly subdivided into groups of suitable size.

The size chosen for the groups results from weighing up the management complexity for the organization and storage of the groups (preferably large groups with little complexity) and the loss of defect-free memory area in the event of the entire group being rejected due to a defective memory cell (preferably small groups with little loss).

After a test of the memory cells, which test can be carried out while the memory cells are still with the manufacturer or, alternatively, not until the memory cells are with the customer, those groups that contain exclusively defect-free memory cells are entered into a memory configuration table. An assignment unit then carries out the memory accesses according to the entries in the memory configuration table, that is to say, accesses only memory cells of defect-free groups.

The total memory area results from stringing together the memory cells of the defect-free groups. Consequently, the total capacity of the memory module also need not be defined once and for all with fabrication. Rather, the capacity may result only after a memory test, or may even vary in the course of the module lifetime, without the module ever having to be rejected as a whole.

In accordance with another feature of the invention, the memory cell array of the integrated dynamic memory has a plurality of word lines and a plurality of bit lines, memory cells respectively being disposed at the crossover point between a word line and a bit line.

In accordance with a further feature of the invention, each of the plurality of groups contains the same number of memory cells. This configures the management of the groups and the capacity calculation in a particularly simple manner.

In accordance with an added feature of the invention, the groups of memory cells are organized such that each of the plurality of groups contains at least one word line. In such a case, it has proved to be particularly advantageous if each of the plurality of groups contains exactly one word line. In that case, on one hand, ascertaining a defect within a group and the management of the defect-free groups is simple and uncomplicated and, on the other hand, not an excessively large amount of memory space is given away by virtue of the entire group being removed from the list of the defect-free groups in the event of a single defective memory cell.

In accordance with an additional feature of the invention, in the integrated dynamic memory, the assignment of the memory cells to the groups is defined once, and the list of the defect-free groups is stored in a permanent manner in the memory configuration table. The single definition of the assignment then typically takes place after production whilst still with the manufacturer. However, it also lies within the scope of the invention not to define and store the assignment until later, possibly not until with the customer.

In accordance with yet another feature of the invention, in the integrated dynamic memory, the assignment of the memory cells to the groups is defined repeatedly, and the list of the defect-free groups is stored in an overwriteable manner in the memory configuration table.

To such an end, in accordance with yet a further feature of the invention, the integrated dynamic memory may advantageously have a self-test unit for functional testing of the memory cells, which, during operation, in response to a request signal, tests the memory cells of the memory cell array for defectiveness and which interacts with the assignment unit such that the assignment unit stores a list of the defect-free groups in the memory configuration table in an overwriteable manner. Such a request signal may be generated, for instance, during every boot operation of the computer into which the memory module is incorporated.

In such a refinement, the storage capacity of the module is not necessarily fixed for the entire lifetime, rather it may slowly decrease over the course of time as a result of increasingly occurring cell defects, without the memory module ever becoming non-functional as a whole.

In accordance with yet an added feature of the invention, the total capacity of the memory cells associated with the defect-free groups is entered in a readable register. This information is then available during the system start-up by a simple read-out operation.

With the objects of the invention in view, there is also provided a method for operating an integrated dynamic memory having a memory configuration table and a memory cell array with memory cells, including the steps of assigning each of the memory cells to one of a plurality of groups, testing the memory cells for functionality once, entering into the memory configuration table each of the groups having exclusively defect-free memory cells, and during further operation, executing memory accesses only to memory cells assigned to a defect-free group entered into the memory configuration table.

With the objects of the invention in view, there is also provided a method for operating an integrated dynamic memory having a memory configuration table and a memory cell array with memory cells, including the steps of testing the memory cells for functionality in response to a request signal and entering into the memory configuration table each of the groups having exclusively defect-free memory cells in an overwriteable manner.

In both operating methods, it is preferred if, after the functional testing of the memory cells, the total capacity of all the memory cells associated with defect-free groups is entered into a readable register.

Other features that are considered as characteristic for the invention are set forth in the appended claims.

Although the invention is illustrated and described herein as embodied in an integrated dynamic memory and method for operating it, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 1 is a block circuit diagram of an integrated memory according to the invention;

FIG. 2 is a fragmentary schematic circuit diagram of a matrix-type memory cell array according to the invention;

DESCRIPTION OF THE PREFERRED EMBODIMENTS

Figure 3:
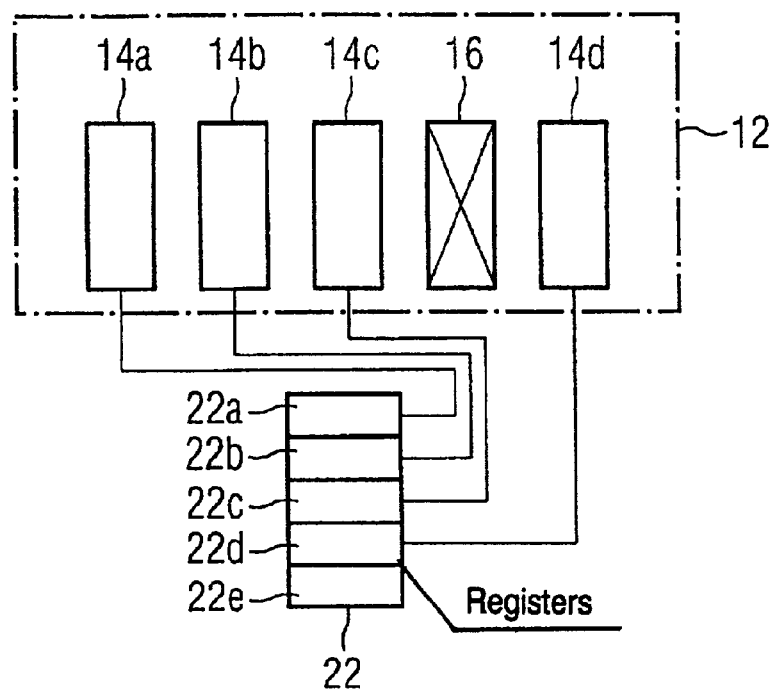
FIG. 3 is a block circuit diagram of an assignment of entries of the memory configuration table to defect-free groups for the embodiment of FIG. 1.

Referring now to the figures of the drawings in detail and first, particularly to FIG. 1 thereof, there is shown a block diagram of an exemplary embodiment of an integrated DRAM memory 10 according to the invention having a memory cell array 12 organized in matrix form. As can best be discerned in FIG. 2, the memory cell array 12 contains an array of memory cells 44 that are respectively disposed at the crossover point between a word line 40 and a bit line 42.

Each memory cell 44 contains a selection transistor T and a storage capacitor C. After the activation of a word line 40, a charge stored on the capacitor C respectively flows through the activated selection transistor T to the associated bit line 42, where it causes a voltage level change that is amplified by a non-illustrated sense amplifier associated with the bit line and is read out.

The memory cell array 12 is subdivided into a plurality of groups 14, 16, each memory cell 44 being associated with exactly one group. In such a case, the assignment is effected in accordance with the defined size of the groups. By way of example, in FIG. 2, each group includes precisely two adjacent word lines 40.

After the production of the DRAM memory 10, an external test unit tests the memory cells 11. Groups that contain exclusively defect-free memory cells are entered with their address into the memory configuration table 22 (i.e., group 14 in FIG. 1). Groups having at least one defective memory cell are regarded as defective in their entirety (i.e., group 16 in FIG. 1) and are not entered.

The total capacity of the memory 10, resulting from the totality of the defect-free groups 14, is entered into a readable register 24, so that the capacity of each memory module can be read out, for example, during the booting of a computer, and be used for determining the total available memory.

The access to the integrated memory by an external control circuit 30 is then effected through the assignment unit 20. The assignment unit 20, with recourse to the addresses of defect-free groups 14 stored in the table 22, carries out the conversion of an external address to an on-chip address within one of the defect-free groups 14.

The table entries in the memory configuration table 22 and the assignment to defect-free groups are illustrated diagramatically in FIG. 3. For the sake of simple illustration, the memory cell array 12 is subdivided into only five groups. In practice, a memory cell array is generally subdivided into significantly more groups. By way example, each group may include one or two word lines 40 so that a memory cell array having, for example, 4096 word lines contains 4096 or 2048 groups.

In the case of the five groups of FIG. 3, defective memory cells were ascertained in one group (reference symbol 16) during the memory test. The remaining groups 14a–14d contain exclusively defect-free memory cells. Their respective addresses are accordingly entered into four registers 22a–22d of the table 22. The fifth register 22e of the table does not refer to a group, but rather contains an entry that indicates the end of the defect-free groups, for example, a pointer to NIL.

In FIG. 2, for illustration purposes only, two word lines 40 are shown as being combined to form a group 14. All of the groups are preferably of the same size to keep simple the calculation of the storage capacity and the management of the groups. Furthermore, it is advantageous if each group contains only a few, in particular, only a single word line 40.

If the groups 14, 16 correspond to the word lines 40, the organization and management of the groups is simple. At the same time, the loss of memory cells is not excessively large if a group has to be deleted from the list of the defect-free groups due to a defective memory cell.

Figure 4:
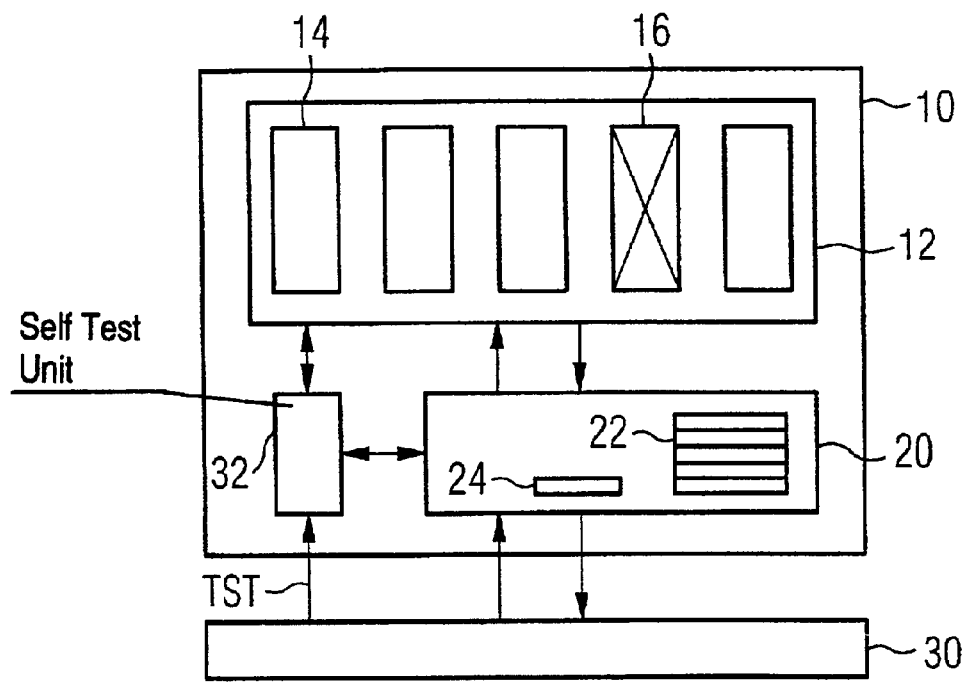
FIG. 4 is a block circuit diagram of a further exemplary embodiment of an integrated memory according to the invention.

FIG. 4 shows a further exemplary embodiment of the invention. The integrated memory 10 of FIG. 4 contains, in addition to the elements already described above, a self-test unit 32, which, in response to receiving a request signal TST, carries out a memory test on the memory cell array 12. Such a request signal may be generated, for example, during the booting of the computer and be fed to the self-test unit.

During the memory test, the self-test unit ascertains those groups containing defective memory cells. The groups having exclusively defect-free memory cells 44 are then entered dynamically into the rewriteable memory configuration table 22. The total free storage capacity is calculated and stored in the rewriteable register 24.

In such an embodiment, the storage capacity may vary over the module lifetime; by way of example, it may slowly decrease over the course of time as a result of increasingly occurring cell defects, without the memory module ever becoming non-functional as a whole.

We claim:

1. An integrated dynamic memory, comprising:
   a memory cell array having memory cells, each of said memory cells assigned to one of a plurality of cell groups, said plurality of cell groups divided into:
      defect-free groups having exclusively defect-free memory cells; and
      defective groups having at least one defective memory cell;
   a memory configuration table connected to said memory cell array and adapted to contain a list identifying said defect-free groups; and
   an assignment unit connected to said memory configuration table, said assignment unit programmed to execute memory accesses only to said memory cells of said defect-free groups based upon said list in said memory configuration table;
   said memory cell array having word lines and bit lines;
   said memory cells disposed at respective crossover points of one of said word lines and one of said bit lines;
   each of said plurality of cell groups having exactly one word line.

2. The integrated dynamic memory according to claim 1, wherein each of said plurality of cell groups has the same number of said memory cells.

3. The integrated dynamic memory according to claim 1, wherein each of said plurality of cell groups has at least one of said word lines.

4. The integrated dynamic memory according to claim 1, including at least one readable register connected to said assignment unit, said at least one register being adapted to store a total capacity of said memory cells assigned to said defect-free groups.

5. An integrated dynamic memory, comprising:
   a memory cell array having memory cells, each of said memory cells assigned to one of a plurality of cell groups, said plurality of cell groups divided into:
      defect-free groups having exclusively defect-free memory cells; and
      defective groups having at least one defective memory cell;
   a memory configuration table connected to said memory cell array and adapted to contain a list identifying said defect-free groups; and
   an assignment unit connected to said memory configuration table, said assignment unit programmed to execute memory accesses only to said memory cells of said defect-free groups based upon said list in said memory configuration table;
   assignment of said memory cells to said cell groups being defined once; and
   said list identifying said defect-free groups permanently stored in said memory configuration table.

6. The integrated dynamic memory according to claim 5, wherein:
   said memory cell array has:
      word lines; and
      bit lines; and
   said memory cells are disposed at respective crossover points of one of said word lines and one of said bit lines.

7. The integrated dynamic memory according to claim 5, wherein each of said plurality of cell groups has the same number of said memory cells.

8. The integrated dynamic memory according to claim 7, wherein each of said plurality of cell groups has at least one of said word lines.

9. The integrated dynamic memory according to claim 5, wherein each of said plurality of cell groups has at least one of said word lines.

10. An integrated dynamic memory, comprising:
    a memory cell array having memory cells, each of said memory cells assigned to one of a plurality of cell groups, said plurality of cell groups divided into:
       defect-free groups having exclusively defect-free memory cells; and
       defective groups having at least one defective memory cell;
    a memory configuration table connected to said memory cell array and adapted to contain a list identifying said defect-free groups; and
    an assignment unit connected to said memory configuration table, said assignment unit programmed to execute memory accesses only to said memory cells of said defect-free groups based upon said list in said memory configuration table;
    each of said memory cells being permanently defined once to a respective group of said cell groups; and
    said list identifying said defect-free groups being permanently stored in said memory configuration table.

11. The integrated dynamic memory according to claim 10, wherein:
    said memory cell array has:
       word lines; and
       bit lines; and
    said memory cells are disposed at respective crossover points of one of said word lines and one of said bit lines.

12. The integrated dynamic memory according to claim 10, wherein each of said plurality of cell groups has the same number of said memory cells.

13. The integrated dynamic memory according to claim 12, wherein each of said plurality of cell groups has at least one of said word lines.

14. The integrated dynamic memory according to claim 10, wherein each of said plurality of cell groups has at least one of said word lines.

15. An integrated dynamic memory, comprising:
    a memory cell array having memory cells, each of said memory cells assigned to one of a plurality of cell groups, said plurality of cell groups divided into:
       defect-free groups having exclusively defect-free memory cells; and defective groups having at least one defective memory cell;

a memory configuration table connected to said memory cell array and adapted to contain a list identifying said defect-free groups; and an assignment unit connected to said memory configuration table, said assignment unit programmed to execute memory accesses only to said memory cells of said defect-free groups based upon said list in said memory configuration table assignment of said memory cells to said cell groups being defined repeatedly; and said list identifying said defect-free groups being overwriteably stored in said memory configuration table.

16. The integrated dynamic memory according to claim 15, including a self-test unit for functional testing of said memory cells, said self-test unit programmed to:

during operation, test said memory cells for defectiveness in response to a request signal; and interact with said assignment unit to store the list of said defect-free groups in said memory configuration table with said assignment unit.

17. The integrated dynamic memory according to claim 16, wherein said self-test unit is programmed to interact with said assignment unit to overwrite the list of said defect-free groups in said memory configuration table with said assignment unit.

18. The integrated dynamic memory according to claim 15, wherein:

said memory cell array has:
word lines; and
bit lines; and said memory cells are disposed at respective crossover points of one of said word lines and one of said bit lines.

19. The integrated dynamic memory according to claim 15, wherein each of said plurality of cell groups has the same number of said memory cells.

20. The integrated dynamic memory according to claim 19, wherein each of said plurality of cell groups has at least one of said word lines.

21. The integrated dynamic memory according to claim 15, wherein each of said plurality of cell groups has at least one of said word lines.

22. An integrated dynamic memory, comprising:

a memory cell array having memory cells, each of said memory cells assigned to one of a plurality of cell groups, said plurality of cell groups divided into:
defect-free groups having exclusively defect-free memory cells; and
defective groups having at least one defective memory cell;

a memory configuration table connected to said memory cell array and adapted to contain a list identifying said defect-free groups; and an assignment unit connected to said memory configuration table, said assignment unit programmed to execute memory accesses only to said memory cells of said defect-free groups based upon said list in said memory configuration table each of said memory cells being replaceably defined to one group of said cell groups; and said list identifying said defect-free groups being replaceably stored in said memory configuration table.

23. The integrated dynamic memory according to claim 22, including a self-test unit for functional testing of said memory cells, said self-test unit programmed to:

during operation, test said memory cells for defectiveness in response to a request signal; and interact with said assignment unit to store the list of said defect-free groups in said memory configuration table with said assignment unit.

24. The integrated dynamic memory according to claim 23, wherein said self-test unit is programmed to interact with said assignment unit to overwrite the list of said defect-free groups in said memory configuration table with said assignment unit.

25. The integrated dynamic memory according to claim 22, wherein:

said memory cell array has:
word lines; and
bit lines; and said memory cells are disposed at respective crossover points of one of said word lines and one of said bit lines.

26. The integrated dynamic memory according to claim 22, wherein each of said plurality of cell groups has the same number of said memory cells.

27. The integrated dynamic memory according to claim 26, wherein each of said plurality of cell groups has at least one of said word lines.

28. The integrated dynamic memory according to claim 22, wherein each of said plurality of cell groups has at least one of said word lines.

29. A method for operating an integrated dynamic memory having a memory configuration table and a memory cell array with memory cells, which comprises:

assigning each of the memory cells to one of a plurality of groups;

testing the memory cells for functionality in response to a request signal;

overwriting, into the memory configuration table, each of the groups having exclusively defect-free memory cells; and during further operation, executing memory accesses only to memory cells assigned to a defect-free group entered into the memory configuration table.

30. The method according to claim 29, which further comprises entering into a readable register a total capacity of all of the memory cells assigned to the defect-free groups after the functional testing of the memory cells.

31. A method for operating an integrated dynamic memory having a memory configuration table and a memory cell array with memory cells, which comprises:

assigning each of the memory cells to one of a plurality of groups;

testing the memory cells for functionality once;

entering into the memory configuration table each of the groups having exclusively defect-free memory cells;

during further operation, executing memory accesses only to memory cells assigned to a defect-free group entered into the memory configuration table; and entering into a readable register a total capacity of all of the memory cells assigned to the defect-free groups after the functional testing of the memory cells.

32. A method for operating an integrated dynamic memory having a memory configuration table and a memory cell array with memory cells, which comprises:

assigning each of the memory cells to one of a plurality of groups;

testing the memory cells for functionality in response to a request signal;

entering into the memory configuration table each of the groups having exclusively defect-free memory cells in an overwriteable manner;

during further operation, executing memory accesses only to memory cells assigned to a defect-free group entered into the memory configuration table; and entering into a readable register a total capacity of all of the memory cells assigned to the defect-free groups after the functional testing of the memory cells.

* * * * *